(12) United States Patent
Chung

(10) Patent No.: US 6,952,377 B2
(45) Date of Patent: Oct. 4, 2005

(54) MEMORY DEVICE AND METHOD FOR WRITING DATA IN MEMORY CELL WITH BOOSTED BITLINE VOLTAGE

(75) Inventor: In-young Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/824,784

(22) Filed: Apr. 15, 2004

(65) Prior Publication Data

US 2005/0105344 A1 May 19, 2005

(30) Foreign Application Priority Data

Oct. 29, 2003 (KR) ................................ 10-2003-0075815

(51) Int. Cl.[7] ............................................... G11C 7/00
(52) U.S. Cl. .............. 365/230.01; 365/149; 365/189.09
(58) Field of Search ........................... 365/230.01, 149, 365/189.09, 189.11

(56) References Cited

U.S. PATENT DOCUMENTS

| | | | | |
|---|---|---|---|---|
| 5,933,386 A | * | 8/1999 | Walker | ................ 365/230.01 |
| 6,055,192 A | * | 4/2000 | Mobley | ................. 365/189.11 |
| 6,169,701 B1 | * | 1/2001 | Eto | ....................... 365/230.06 |
| 6,751,152 B2 | * | 6/2004 | Hsu | ............................ 365/203 |
| 6,876,590 B2 | * | 4/2005 | Joachim | ..................... 365/201 |

FOREIGN PATENT DOCUMENTS

KR          10-0214462          5/1999          ......... G11C/11/407

* cited by examiner

*Primary Examiner*—Son Mai
(74) *Attorney, Agent, or Firm*—Mills & Onello LLP

(57) ABSTRACT

Provided are a method of writing data into a memory cell with a boosted write voltage and a memory device that performs the method. The method involves (a) transmitting data input in response to a write command to a bitline; (b) writing the input data on the bitline into a memory cell capacitor via a memory cell transistor; (c) generating a write boosting signal in response to the write command and a bitline precharge signal; (d) boosting a voltage of a capacitor connected between the write boosting signal and the bitline in response to the write boosting signal; (e) boosting a voltage of the bitline to a predetermined level; and (f) rewriting the input data into the memory cell capacitor with the boosted voltage of the bitline.

10 Claims, 3 Drawing Sheets

MEMORY DEVICE AND METHOD FOR WRITING DATA IN MEMORY CELL WITH BOOSTED BITLINE VOLTAGE

BACKGROUND OF THE INVENTION

This application claims the priority of Korean Patent Application No. 2003-75815, filed on Oct. 29, 2003, in the Korean Intellectual Property Office, the contents of which are incorporated herein in their entirety by reference.

1. Field of the Invention

The present invention relates to a semiconductor memory device, and more particularly, to a method of writing data into a memory cell with a boosted bitline voltage, which is higher than a power supply voltage, and a memory device that performs the method.

2. Description of the Related Art

A dynamic random access memory (DRAM) includes memory cells, and each of the memory cells is comprised of a transistor and a capacitor. Each of the memory cells, i.e., DRAM cells, stores a logic data value of "1" or "0" according to the amount of electric charge stored in its memory cell capacitor. In general, a data value of 1 is stored in a DRAM cell with a power supply voltage level (VCC), and a data value of 0 is stored in a DRAM cell with a ground voltage level (VSS). Due to the characteristics of a DRAM cell, electric charge leaks from a capacitor of the DRAM cell, and thus a voltage level of data stored in the capacitor of the DRAM cell gradually decreases. Given such electric charge leakage, a data value of 1 is preferably stored with a higher voltage level than the power supply voltage level VCC.

Data stored in each DRAM cell is charge-shared between bitlines, and then is sensed and amplified by a bitline sense amplifier. The larger the difference between the amount of electric charge in a cell capacitor holding a data value of 1, and the amount of electric charge of a cell capacitor holding a data value of 0, the higher the efficiency of the bitline sense amplifier sensing data stored in each of the cell capacitors. The amount of electric charge stored in each of the cell capacitors can be increased by increasing the capacitance of each of the cell capacitors. However, since there are numerous restrictions placed on increasing the size of a chip or manufacturing a semiconductor device, there is a clear limit as to the amount by which the capacitance of each of the cell capacitors can be increased.

Therefore, in order to achieve a high sensing efficiency with a given amount of electric charge stored in a cell capacitor with a predetermined capacitance, the voltage of bitlines can be increased after the electric charge stored in the cell capacitor is shared between the bitlines, by decreasing capacitance of each of the bitlines. Alternatively, the bitline voltage can be increased during a sensing process by increasing the amount of electric charge stored in the cell capacitor.

However, if a data value of 1 is written into a DRAM cell capacitor by charging the DRAM cell capacitor with a higher voltage level than the power supply voltage level (VCC), the amount of electric charge stored in the DRAM cell capacitor increases.

SUMMARY OF THE INVENTION

The present invention provides a method of writing data into a memory cell with a boosted voltage level, which is not lower than a power supply voltage level.

The present invention also provides a memory device that performs the method of writing data into a memory cell.

According to an aspect of the present invention, there is provided a method of writing data into a memory cell of a memory device. The method includes (a) transmitting data input in response to a write command to a bitline; (b) writing the input data on the bitline into a memory cell capacitor via a memory cell transistor; (c) generating a write boosting signal in response to the write command and a bitline precharge signal; (d) boosting a voltage of a capacitor connected between the write boosting signal and the bitline in response to the write boosting signal; (e) boosting a voltage of the bitline to a predetermined level; and (f) rewriting the input data into the memory cell capacitor with the boosted voltage of the bitline.

The write boosting signal can be set to a boosted voltage level or an external power supply voltage level, which is higher than a power supply voltage level of the memory device.

In one embodiment, in step (a), the boosted voltage level or the external power supply voltage level is applied to gates of isolation transistors connected between the bitline and a sense amplification unit so that the isolation transistors are turned on.

In one embodiment, in step (f), the power supply voltage level of the memory device is applied to the isolation transistors between the bitline and the sense amplification unit. The isolation transistors can be turned off when the input data is at a logic high level. The isolation transistors can be turned on when the input data is at a logic low level, and then the boosted voltage of the bitline can be dropped to a ground voltage level by the sense amplification unit.

According to another aspect of the present invention, there is provided a memory device. The memory device includes wordlines, which are connected to gates of memory cell transistors; bitlines, which are connected to drains of the memory cell transistors; memory cell capacitors, which are connected to sources of the memory cell transistors; a write boosting signal generation circuit, which generates a write boosting signal in response to a write command, a bitline precharge signal, and a block decoding signal, the block decoding signal selecting a memory cell array including a given memory cell transistor; and capacitors, which are connected between the bitlines and the write boosting signal.

The write boosting signal generation circuit may include a PMOS transistor, a source of which is connected to a power supply voltage and a gate of which is connected to the bitline precharge signal; an NMOS transistor, a source of which is connected to a ground voltage, a gate of which is connected to a bitline sensing signal, and a drain of which is connected to a drain of the PMOS transistor; a latch unit, which is connected to the drains of the PMOS transistor and the NMOS transistor; a first NAND gate, which receives an output of the latch unit and the write command; an inverter, which inverts an output of the NAND gate; and a second NAND gate, which is driven by a boosted voltage or an external power supply voltage higher than the power supply voltage, the second NAND gate outputting the write boosting signal in response to an output of the inverter and the block decoding signal.

In one embodiment, the memory device further includes: a sense amplification unit, which senses and amplifies a voltage of each of the bitlines; and an isolation transistor, which is located between the bitline and the sense amplification unit, the transistor being gated by a bitline isolation signal. The bitline isolation signal can have a boosted voltage level, when data is written into each of the memory cell capacitors with the write boosting signal inactivated, and can have a power supply voltage level, when data is written into each of the memory cell capacitors with the write boosting signal activated. Therefore, according to the present invention, the amount of electric charge stored in a memory cell capacitor increases because the memory cell capacitor is charged, via a bitline, with a higher voltage level than a power supply voltage level. The memory cell capacitor is charged with a higher voltage level during a write boosting operation that is performed in response to a write boosting signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
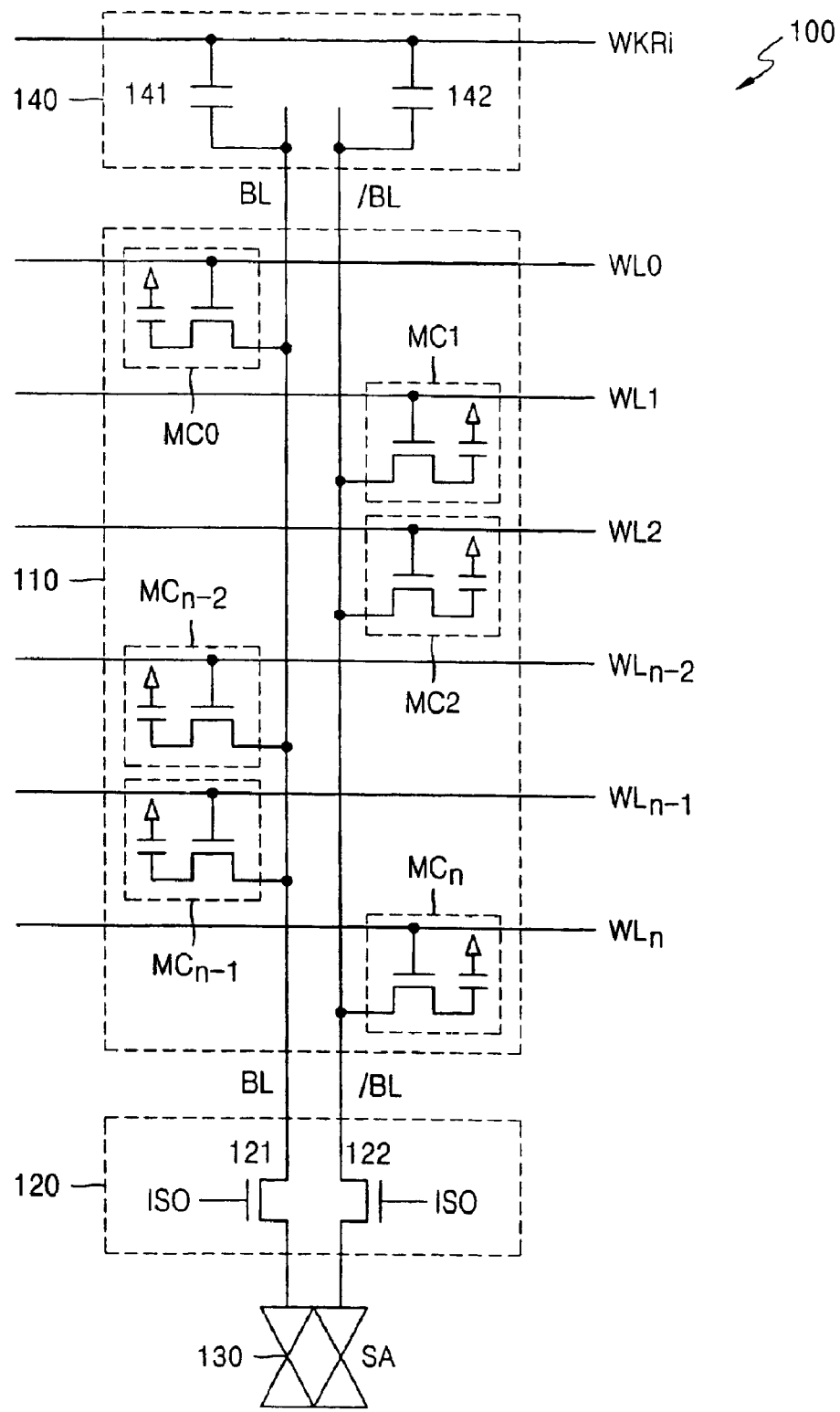
FIG. 1 is a circuit diagram illustrating the structure of a bitline pair of a memory device according to an embodiment of the present invention.

FIG. 1 is a circuit diagram illustrating the structure of a bitline pair of a memory device 100 according to an embodiment of the present invention. Referring to FIG. 1, the memory device 100 includes a memory cell array 110, a bitline isolation unit 120, a sense amplification unit 130, and a bitline capacitor unit 140. In the memory cell array unit 110, memory cells MC0, MC1, MC2, MCn-2, MCn-1, and MCn are arranged at intersection points between a wordline WL0 and a bitline BL, between a wordline WL1 and a complementary bitline /BL, between a wordline WL2 and the complimentary bitline /BL, between a wordline WLn-2 and the bitline BL, between a wordline WLn-1 and the bitline BL, and between a wordline WLn and the complementary bitline /BL, respectively. The bitline isolation unit 120 selectively connects the bitline BL or the complementary bitline /BL to the sense amplification unit 130 via a transistor 121 or 122. The transistors 121 and 122 respond to a bitline isolation signal ISO. The bitline sense amplification unit 130 senses and amplifies memory cell data that is transmitted along the bitline BL or the complementary bitline /BL. The bitline capacitor unit 140 includes capacitors 141 and 142 connected between a write boosting signal WKRi and the bitline BL and between the write boosting signal WKRi and the complementary bitline /BL, respectively. The write boosting signal WKRi is generated by a write boosting signal generation circuit 200 of FIG. 2.

Figure 2:
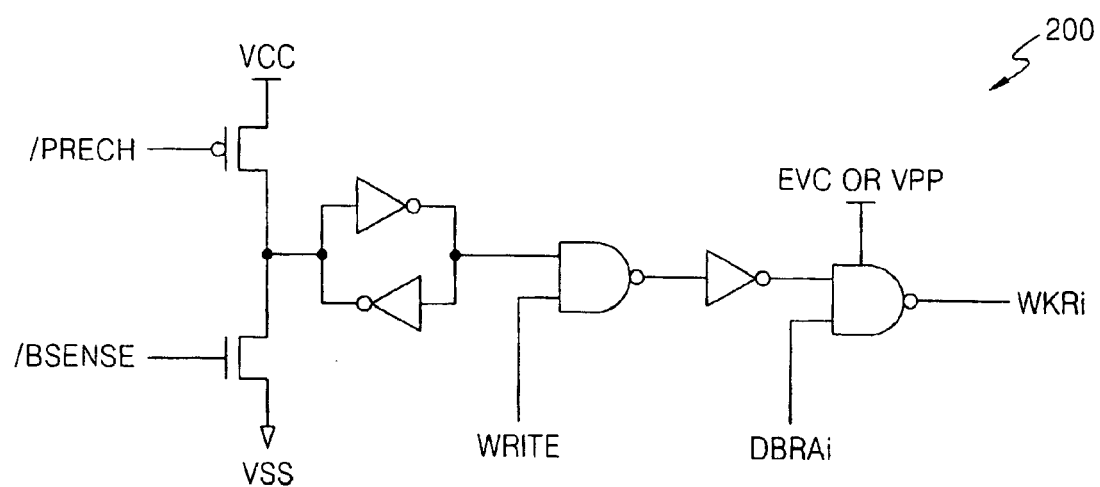
FIG. 2 is a circuit diagram illustrating a write boosting signal generation circuit according to an embodiment of the present invention.

Referring to FIG. 2, the write boosting signal generation circuit 200 generates the write boosting signal WKRi in response to a precharge signal /PRECH when a block decoding signal DBRAi, which selects the memory cell array 110 of FIG. 1 during a write command WRITE, is activated. That Is, when the write command WRITE and the block decoding signal DBRAi are activated to a logic high level, the write boosting signal WKRi having an external power supply voltage level EVC or a boosted voltage level VPP is generated when the precharge signal /PRECH has a low logic level.

Figure 3:
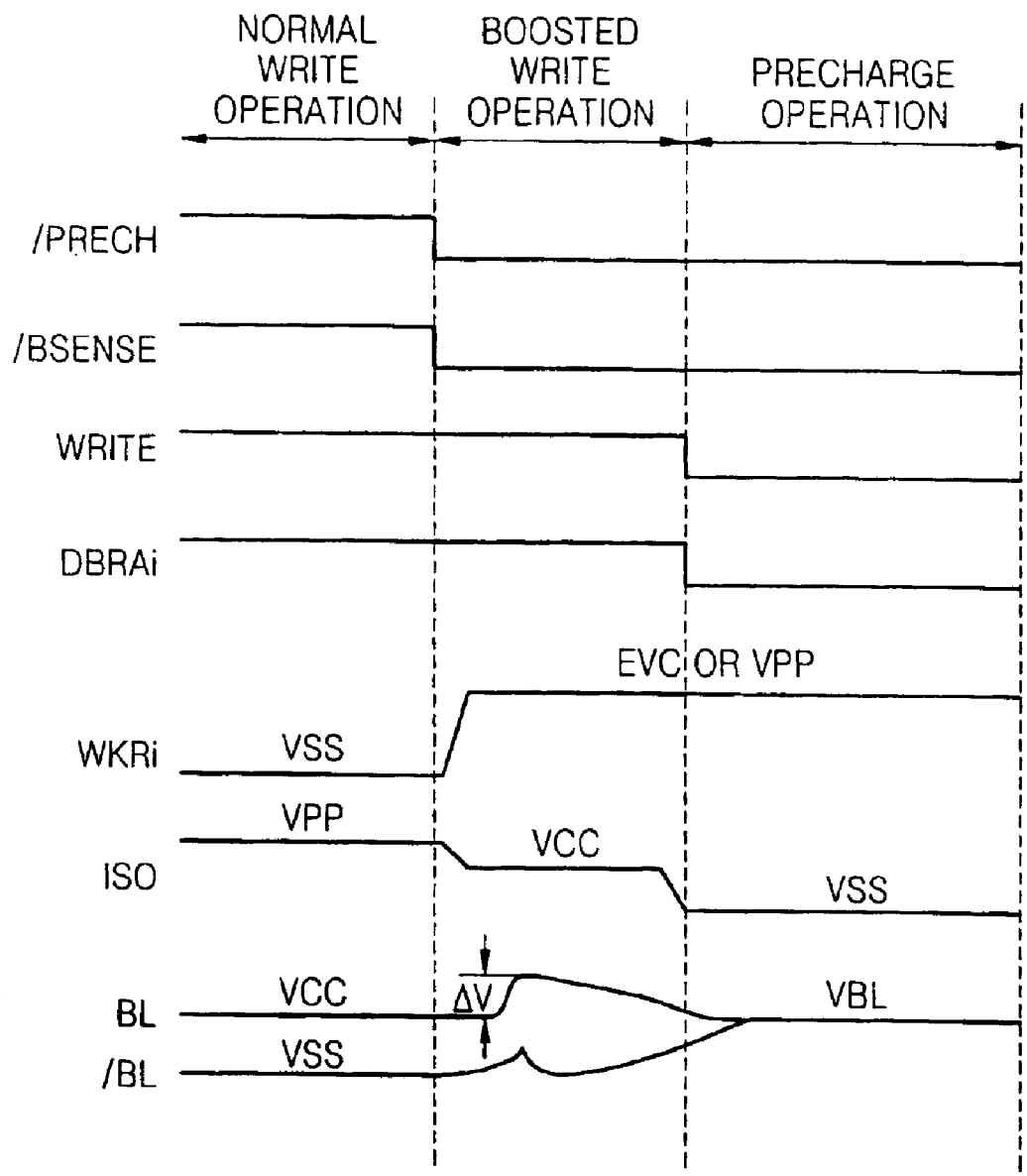
FIG. 3 is a timing diagram illustrating the operation of the memory device of FIG. 1.

FIG. 3 is a timing diagram illustrating a write operation performed by the memory device 100 of FIG. 1 in conjunction with the write boosting signal generation circuit 200. Referring to FIG. 3, the write operation of the memory device 100, which is divided into a normal write operation and a boosted write operation, is followed by a precharge operation.

In the normal write operation, data is written into the memory cells MC0, MC1, MC2, MCn-2, MCn-1, and MCn with a voltage of the bitline BL or a voltage of the complementary bitline /BL, i.e., with a power supply voltage VCC or a ground voltage VSS. The difference between the voltage of the bitline BL and the voltage of the complementary bitline /BL is the same as the difference between the power supply voltage VCC and the ground voltage VSS. The write boosting signal WKRi is set to a ground voltage level VSS when the precharge signal /PRECH is inactivated to a logic high level, a bitline sensing signal /BSENSE is set to a logic high level, the write command is activated to a logic high level, and the block decoding signal DBRAi is activated to a logic high level. The bitline isolation signal ISO with the boosted voltage level VPP is transmitted to the bitline BL and the complementary bitline /BL without dropping the voltage of the transistors 121 and 122.

In the boosted write operation, the difference between the voltage of the bitline BL and the voltage of the complementary bitline /BL in the normal write operation is enlarged by $\Delta V$. Then, data is written into the memory cells MC0, MC1, MC2, MCn-2, MCn-1, and MCn with VCC+$\Delta V$ or VSS. The write boosting signal WKRi is set to the boosted voltage level VPP or the external power supply voltage level EVC when the precharge signal /PRECH is activated to a logic low level, the bitline sensing signal /BSENSE is set to a logic low level, the write command WRITE is activated to a logic high level, and the block decoding signal DBRAi is activated to a logic high level. The voltage of the bitline isolation signal ISO varies from the boosted voltage level VPP to the power supply voltage level VCC so that the transistors 121 and 122 are selectively turned off. The capacitors 141 and 142 are boosted by the write boosting signal WKRi, i.e., the boosted voltage level VPP or the external power supply voltage level EVC, so that the voltage of the bitline and the complementary bitline /BL is boosted by $\Delta V$. Accordingly, the voltage of the bitline BL amounts to VCC+$\Delta V$, and the transistor 121 is turned off. Thus, data is written into a selected memory cell with VCC+$\Delta V$. The complementary bitline /BL is boosted to VSS+$\Delta V$. However, the sense amplification unit 130 returns the voltage of the complementary bitline /BL to the ground voltage level VSS using the transistor 122, which is turned on. Therefore, data is written into a selected memory cell with the ground voltage level.

In the precharge operation after the write operation, the bitline BL and the complementary bitline /BL are precharged to a precharge voltage VBL for preparing a next read command READ or write command WRITE. The write boosting signal WKRi is maintained at the boosted voltage level VPP or the external power supply voltage level EVC in response to the write command, which is inactivated to a logic low level, and the block decoding signal DBRAi, which is inactivated to a logic low level. The bitline BL or the complementary bitline /BL is disconnected from the sense amplification unit 130 by turning off the transistor 121 or 122, respectively, in response to the bitline isolation signal ISO with the ground voltage level VSS. A precharge circuit (not shown), connected to the bitline BL and the complementary bitline /BL, precharges the bitline BL and the complementary bitline /BL to the precharge voltage VBL.

In the boosted write operation of the present invention, a memory cell capacitor is charged with a higher voltage level than a power supply voltage level, i.e., VCC+ΔV, via the bitline BL, and thus the amount of electric charge stored in the memory cell capacitor increases, which results in an increase in the efficiency of sensing memory cell data in a data read operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of writing data into a memory cell of a memory device, comprising:
   (a) transmitting data input in response to a write command to a bitline;
   (b) writing the input data on the bitline into a memory cell capacitor via a memory cell transistor;
   (c) generating a write boosting signal in response to the write command and a bitline precharge signal;
   (d) boosting a voltage of a capacitor connected between the write boosting signal and the bitline in response to the write boosting signal;
   (e) boosting a voltage of the bitline to a predetermined level; and
   (f) rewriting the input data into the memory cell capacitor with the boosted voltage of the bitline.

2. The method of claim 1, wherein the write boosting signal is set to at least one of a boosted voltage level or an external power supply voltage level, which is higher than a power supply voltage level of the memory device.

3. The method of claim 1, wherein in step (a), the boosted voltage level or the external power supply voltage level is applied to gates of isolation transistors connected between the bitline and a sense amplification unit so that the isolation transistors are turned on.

4. The method of claim 1, wherein in step (f), the power supply voltage level of the memory device is applied to the isolation transistors between the bitline and the sense amplification unit.

5. The method of claim 4, wherein the isolation transistors are turned off when the input data is at a logic high level.

6. The method of claim 4, wherein the isolation transistors are turned on when the input data is at a logic low level, and then the boosted voltage of the bitline is dropped to a ground voltage level by the sense amplification unit.

7. A memory device, comprising:
   wordlines, which are connected to gates of memory cell transistors;
   bitlines, which are connected to drains of the memory cell transistors;
   memory cell capacitors, which are connected to sources of the memory cell transistors;
   a write boosting signal generation circuit, which generates a write boosting signal in response to a write command, a bitline precharge signal, and a block decoding signal, the block decoding signal selecting a memory cell array including a given memory cell transistor; and
   capacitors, which are connected between the bitlines and the write boosting signal.

8. The memory device of claim 7, wherein the write boosting signal generation circuit comprises:
   a PMOS transistor, a source of which is connected to a power supply voltage and a gate of which is connected to the bitline precharge signal;
   an NMOS transistor, a source of which is connected to a ground voltage, a gate of which is connected to a bitline sensing signal, and a drain of which is connected to a drain of the PMOS transistor;
   a latch unit, which is connected to the drains of the PMOS transistor and the NMOS transistor;
   a first NAND gate, which receives an output of the latch unit and the write command;
   an inverter, which inverts an output of the NAND gate; and
   a second NAND gate, which is driven by a boosted voltage or an external power supply voltage higher than the power supply voltage, the second NAND gate outputting the write boosting signal in response to an output of the inverter and the block decoding signal.

9. The memory device of claim 7 further comprising:
   a sense amplification unit, which senses and amplifies a voltage of each of the bitlines; and
   an isolation transistor, which is located between the bitline and the sense amplification unit, the transistor being gated by a bitline isolation signal.

10. The memory device of claim 9, wherein the bitline isolation signal has a boosted voltage level, when data is written into each of the memory cell capacitors with the write boosting signal inactivated, and has a power supply voltage level, when data is written into each of the memory cell capacitors with the write boosting signal activated.

* * * * *